United States Patent
Bartenstein et al.

(10) Patent No.: US 6,901,542 B2
(45) Date of Patent: May 31, 2005

(54) INTERNAL CACHE FOR ON CHIP TEST DATA STORAGE

(75) Inventors: Thomas W. Bartenstein, Owego, NY (US); L. Owen Farnsworth, III, Lincoln, VT (US); Douglas C. Heaberlin, Underhill, VT (US); Edward E. Horton, III, Westford, VT (US); Leendert M. Huisman, South Burlington, VT (US); Leah M. Pastel, Essex, VT (US); Glen E. Richard, Essex Junction, VT (US); Raymond J. Rosner, Colchester, VT (US); Francis Woytowich, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 674 days.

(21) Appl. No.: 09/927,011

(22) Filed: Aug. 9, 2001

(65) Prior Publication Data

US 2003/0033566 A1 Feb. 13, 2003

(51) Int. Cl.⁷ ............... G01R 31/3193; G01R 31/3187; G01R 31/3177
(52) U.S. Cl. ................ 714/719; 714/723; 714/736; 714/738
(58) Field of Search ............................... 714/719, 723, 714/736, 738; G01R 31/3177, 31/3187, 31/3193

(56) References Cited

U.S. PATENT DOCUMENTS

| | | | |
|---|---|---|---|
| 4,969,148 A | 11/1990 | Nadeau-Dostie et al. | |
| 5,222,066 A | 6/1993 | Grula et al. | |
| 5,535,164 A | 7/1996 | Adams et al. | |
| 5,663,965 A | 9/1997 | Seymour | |
| 5,825,783 A | 10/1998 | Momohara | |
| 5,912,901 A | * 6/1999 | Adams et al. | 714/733 |
| 5,954,830 A | * 9/1999 | Ternullo, Jr. | 714/718 |
| 5,974,579 A | 10/1999 | Lepejian et al. | |
| 5,991,215 A | * 11/1999 | Brunelle | 365/201 |
| 5,995,731 A | 11/1999 | Crouch et al. | |
| 6,001,662 A | 12/1999 | Correale, Jr. et al. | |
| 6,072,737 A | 6/2000 | Morgan et al. | |
| 6,125,460 A | 9/2000 | Sim | |
| 6,195,771 B1 | * 2/2001 | Tanabe et al. | 714/718 |
| 6,636,998 B1 | * 10/2003 | Lee et al. | 714/735 |
| 2002/0184580 A1 | * 12/2002 | Archibald et al. | 714/719 |

OTHER PUBLICATIONS

TDB–ACC–NO: NNRD439133; A method for scan based memory test to supplement built–in self–test; IBM technical Disclosure Bulletin, Issue No. 439; Nov. 2000, UK; p. 2015.*

Matsumura, T.; An efficient test method for embedded multi–port RAM with BIST circuitry; □□Memory Technology, Design and Testing, 1995., Records of the 1995 IEEE International Workshop on , Aug. 7–8, 1995; pp.: 62–67.*

IBM Technical Disclosure Bulletin, vol. 34, No. 1, Jun. 1991, Array Built–In Self–Test with Diagnostic Logic, T. K. Jaber, pp. 59–61.

* cited by examiner

Primary Examiner—R. Stephen Dildine
(74) Attorney, Agent, or Firm—Schmeiser, Olsen & Watts; Robert A. Walsh

(57) ABSTRACT

A method of testing a semiconductor device having a memory is disclosed. The method includes selecting a portion of the memory; testing the selected portion of the memory; designating the selected portion of the memory as a designated memory in response to an acceptable testing result; and storing data in the designated portion of the memory for retrieval at a later time. Provision for soft repair of the selected memory is made. Test data can be compressed before being stored in the designated memory.

33 Claims, 8 Drawing Sheets

US 6,901,542 B2

INTERNAL CACHE FOR ON CHIP TEST DATA STORAGE

FIELD OF THE INVENTION

The present invention relates to the field of testing semiconductor devices; more specifically, it relates to a testing method of a semiconductor device having an embedded memory array.

BACKGROUND OF THE INVENTION

Semiconductor devices include various circuits according to the functions the device has been designed to perform. The circuits generally comprise memory arrays for storing data and logic circuits for performing the device design functions as well as controlling the overall functioning of all circuits in the semiconductor device.

A tester is used for testing the functions of the semiconductor device. To test the semiconductor device, a test program including test patterns designed to test the semiconductor device functions, is loaded into the tester and the tester applies the patterns to the semiconductor device. The results of the test are compared to expected responses and a determination is made as to whether or not the semiconductor has passed or failed the test.

Today's technology allows for some of the function of testing to be placed on the semiconductor device itself. For example, array built in self-test (ABIST) functions are used to test memory arrays and logic built in self-test (LBIST) functions are used to test logic functions.

A problem with testing today's large semiconductor devices, even using ABIST and LBIST, is providing the required test data to the device under test (DUT) and then collecting the results of the application of those tests. This is particularly difficult when the tests have to be applied at high speeds, and the test results have to be collected without interfering with the application of the test. An example is the expected signatures in a LBIST environment and bitmap data in an ABIST environment.

Collecting test data is further complicated by the fact that the amount of test data can be very large so that a large portion of tester time is spent in moving or waiting for data to be moved. Collecting test data is still further complicated when the resulting test data must be combined during a subsequent diagnostic phase and the final number of bits to be used by the diagnostics is substantially less than the number of bits retrieved from the DUT. This occurs most notably when embedded arrays are tested in a start-stop-retrieve mode, in which a test is partially applied, stopped, diagnostic data retrieved and another portion of the test applied and so on.

In more detail, collecting bit fail map data on embedded arrays from logic parts is a very slow process for testers. One current method is to run ABIST on an embedded array with the tester recording all the cycles that ABIST was in when fails occurred. Then, the test is repeated but with the tester stopping at the first cycle a fail occurred at. Then the fail is read out. In most logic designs, the test cycle must be repeated, from the beginning, for the next fail. If a fail bitmap could be built up and stored on the die, the fail data could be read out to the tester after all the tests were run and the need to repeat the tests from the beginning for each fail would be eliminated and the time for testing would be reduced.

Therefore, a need exists for a method of storing and retrieving test data as a function separate from the application of the test patterns, without interfering with the application of the test patterns or having to stop the tester to save the test results.

SUMMARY OF THE INVENTION

A first aspect of the present invention is a method of testing a semiconductor device having a memory, comprising: selecting a portion of the memory; testing the selected portion of the memory; designating the selected portion of the memory as a designated memory in response to an acceptable testing result; and storing data in the designated portion of the memory for retrieval at a later time.

A second aspect of the present invention is a method of testing a semiconductor device having a memory, comprising: providing a designated memory; performing ABIST on a memory segment to generate memory test data; storing the memory test data in the designated memory; and retrieving the test data at a later time.

A third aspect of the present invention is a method of testing a semiconductor device having a memory, comprising: providing a designated memory; performing LBIST on a device logic function to generate a set of LBIST signatures; storing the LBIST signatures in the designated memory; and retrieving the LBIST signatures at a later time.

A fourth aspect of the present invention is a method of testing a function of a semiconductor device having a memory, comprising: providing a designated memory; performing a first test using a test pattern in a first corner of the test specification of the function of the semiconductor device; storing the result of the first test in the designated memory; performing a second test using the test pattern in a second corner of the test specification of the function of the semiconductor device; retrieving the first test result from the designated memory; and comparing the first test result with the second test result.

A fifth aspect of the present invention is a semiconductor device comprising: a memory; an ABIST engine adapted to test said memory; and an interface adapted to send test data to and receive test data from a designated portion of said memory.

BRIEF DESCRIPTION OF DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION OF THE INVENTION

A first embodiment of the present invention is directed to memory testing, a second embodiment to logic testing and a third embodiment to comparison of test results.

Figure 1:
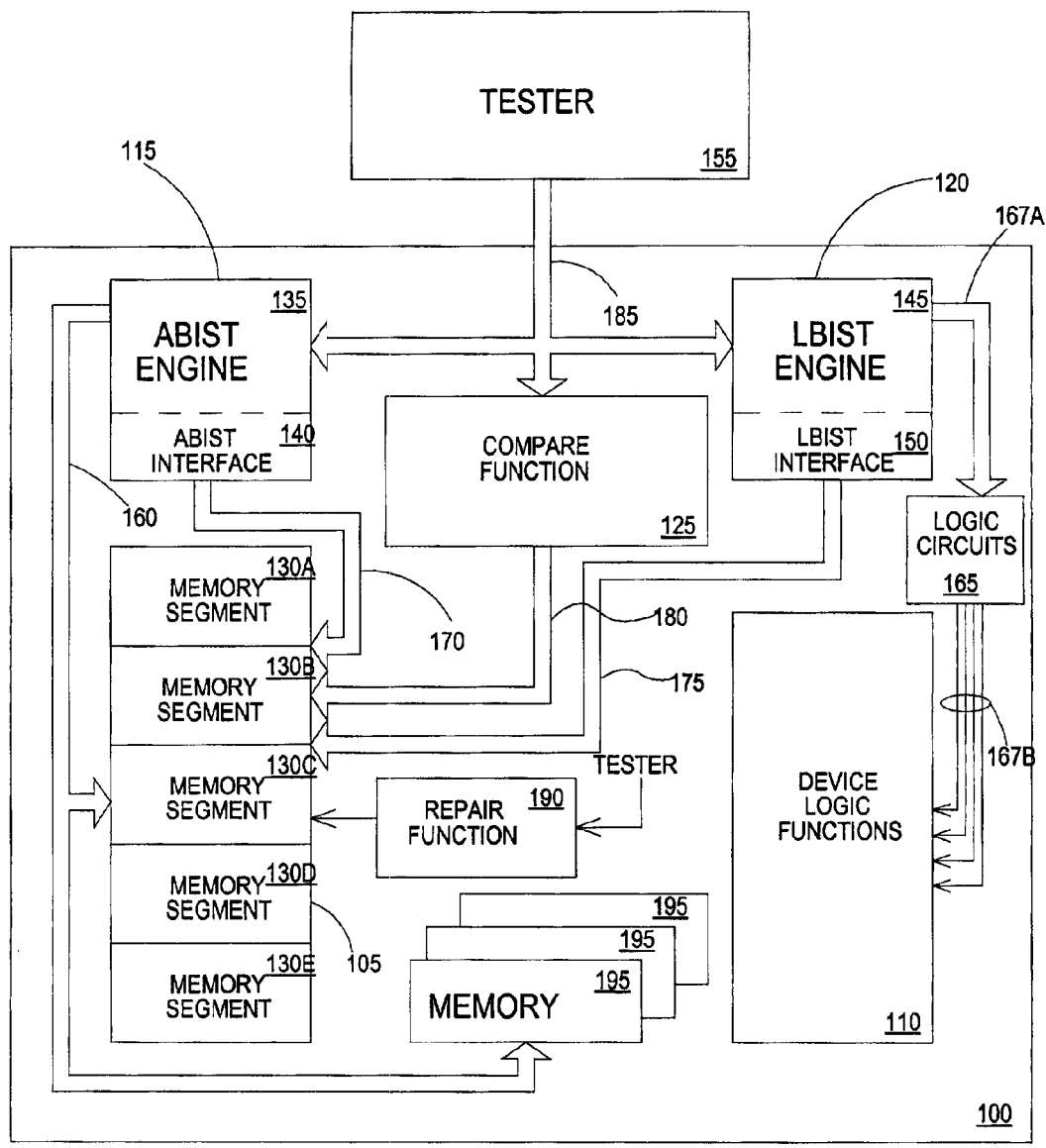
FIG. 1 is a general functional block diagram of a test system according to the present invention.

FIG. 1 is a general functional block diagram of a test system according to the present invention. All three embodiments are illustrated in FIG. 1. In FIG. 1, a semiconductor device 100 includes a memory 105, device logic functions 110, an ABIST function 115, an LBIST function 120 and a compare function 125. Memory 105 comprises a plurality of memory segments 130A through 130E. ABIST function 115 includes an ABIST engine 135 and an ABIST interface 140. Optionally, ABIST engine 135 may include a data decompress function and ABIST interface 140 may include a data compress function. LBIST function 120 includes an LBIST engine 145 and an LBIST interface 150. Optionally, LBIST engine 145 may include a data decompress function and LBIST interface 150 may include a data compress function. Compare function 125 may be used to compare memory bit-fail maps generated by ABIST ENGINE 135 or test result data generated by LBIST engine 145 obtained at different corners. A corner is a specification of the environment in which the test is run. The corner may specify supply voltage, temperature and clock cycle time. Compare function 125 is simply a set of logic that takes two sets of similar data, compares them bit by bit, and then outputs a single bit designating a compare or mis-compare. Optionally, compare function 125 may include a data decompress function. ABIST engine 135 is coupled to memory 105 and additional memory 195 by an ABIST bus 160. LBIST engine 120 is coupled to device logic functions 110 through logic circuits 165 via test data bus 167A and data lines 167B. ABIST interface 140 is coupled to memory 105 by an ABIST interface bus 170. LBIST interface 150 is coupled to memory 105 by an LBIST interface bus 175. Compare function 125 is coupled to memory 105 by a compare bus 180. Tester 155 is coupled to ABIST engine 135, LBIST engine 145 and compare function 125 by tester bus 185. Finally, semiconductor device 100 includes a repair function 190 coupled between tester 155 and memory 105 (or integral with the memory) for performing soft repair of the memory 105. Although FIG. 1 shows the repair function to be controlled by the tester, the repair function could be controlled by ABIST engine 135 or a special repair tool.

Memory 105 may be integral to semiconductor device 100 or external to the semiconductor device, but located in the kerf of the wafer on which the semiconductor device is fabricated, in which case wires connecting memory 105 with semiconductor device 100 would be severed when the wafer is diced. The kerf of the wafer is the non-functional area between semiconductor chips. Similarly, if memory 105 resides in the kerf of the wafer, repair function 190 may also reside in the kerf portions of the wafer.

ABIST engine 135 performs ABIST memory tests on memory 105 (and additional memory 195 as well) and serves to pre-test a particular memory section, one of memory segments 130A through 130E. After a particular memory segment has been pre-tested and found good (or soft repaired) the pre-tested memory segment is designated for storage of test data. ABIST interface 140 communicates with the designated memory segment (in the present example memory segment 130B) for storing and retrieving additional ABIST test data, according to a first embodiment of the present invention. ABIST interface 140 is shown coupled to designated memory segment 130B by ABIST interface bus 170, however the ABIST interface may share ABIST bus 160 or be coupled to the functional memory buses for the purpose of storing and retrieving additional ABIST test data. ABIST function 115, ABIST bus 160 and ABIST interface bus 170 need not be present on semiconductor device if the first embodiment of the present invention is not to be practiced.

LBIST engine 145 performs LBIST logic tests on device logic functions 110 and communicates with designated memory segment 130B for storing and retrieving additional LBIST test data via LBIST interface 150 and LBIST interface bus 175, according to a second embodiment of the present invention. A pre-tested good memory segment is required as part of the second embodiment of the present invention and this may be provided using ABIST engine 135 as described above, or direct memory testing if no ABIST engine 135 has been provided on semiconductor device 100. If the present invention is practiced without the second embodiment, LBIST function 120 and LBIST interface bus 175 need not be present on semiconductor device 100.

Figure 2:
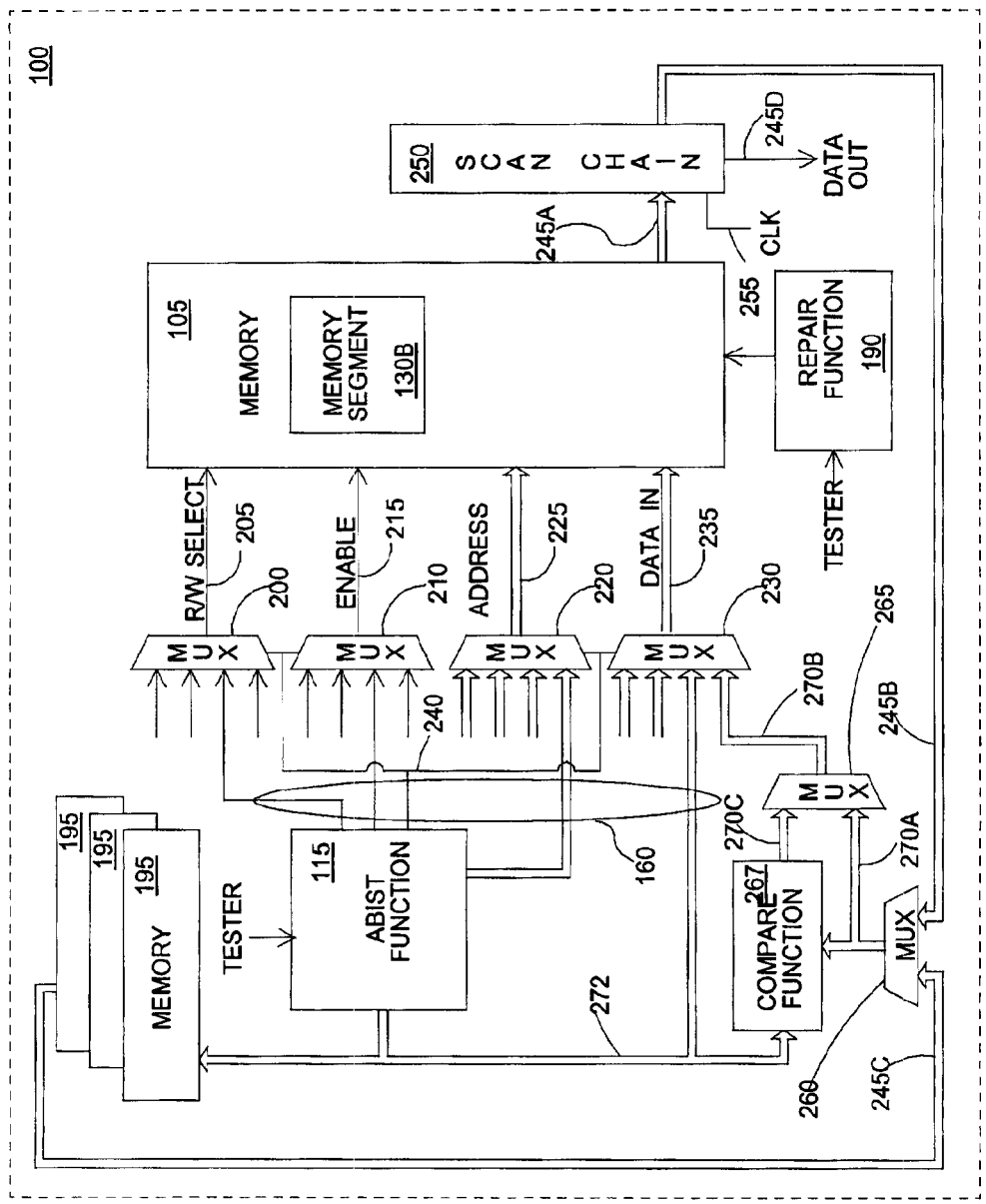
FIG. 2 is a detailed functional block diagram of semiconductor device according to a first embodiment of the present invention.

FIG. 2 is a detailed functional block diagram of a semiconductor device according to a first embodiment of the present invention. In FIG. 2, a read/write (R/W) multiplexer (MUX) 200 is coupled to memory 105 (containing designated memory segment 130B) by a R/W select line 205 for placing memory 105 into a read or a write state in response to a R/W signal applied to the R/W select line by ABIST function 115. An enable MUX 210 is coupled to memory 105 by an enable line 215 for enabling read or write to memory 105 in response to an enable signal applied to the enable line by ABIST function 115.

An address MUX 220 is coupled to memory 105 by an address bus 225 for selecting particular memory segments and particular memory cells in the memory to write data into or read data out of in response to an address word applied to the address bus by ABIST function 115. A data in MUX 230 is coupled to memory 105 by a data bus 235 for writing data applied to the data bus into the memory by ABIST function 115. R/W select MUX 200, enable MUX 210, address MUX 220 and data in MUX 230 are controlled by ABIST function 115 through control lines 240 in ABIST engine bus 160. In the example of FIG. 2, ABIST interface bus 170 and ABIST engine bus 160 illustrated separately in FIG. 1, are one and the same in FIG. 2.

Memory 105 is coupled to latches in a scan chain 250 by a data out bus 245A. A CLK signal 255 controls scan-in and scan out of data from memory 105 through scan chain 250 to a data out bus 245B. In addition the latches in scan chain 250 are connected to a first select MUX 260 via data out bus 245B. Additional memory 195 is coupled to a second input of a first select MUX 260 by a data out bus 245C. First select MUX 260 determines whether test data from memory 105 or additional memory 195 is to be written into designated memory segment 130B. The output of first select MUX 260 is coupled to an input of second select MUX 265 and to a first input of a compare function 267 by a selected data bus 270A. The output of second select MUX 265 is coupled to an input of data in MUX 230 by a selected data bus 270B. Second select MUX 265 determines whether bit-map or bit-fail map data is written into designated memory segment 130B. An ABIST data bus 272 is coupled to a second input of compare function 267 to create bit-fail maps from bit maps by comparing the bit-map to an expected bit map from ABIST function 115. The output of compare function 267 is coupled to a second input of second select MUX 265 by a selected data bus 270C.

Repair function 190 is coupled between the tester and memory 105 (or integral with the memory) for performing soft repair of the memory.

In operation ABIST function 115 tests memory 105, the resultant data flows through scan chain 250, and optionally compare function 267, and is written into designated memory segment 130B. In the case of additional memory 195, ABIST function 115 tests memory 195, and the resultant bit map or bit-fail map is written into memory segment 130B to be scanned out at a later time.

Data collected in designated memory segment 130B is outputted to the tester, for example, by scanning in address data to address MUX 220 (or by having ABIST function 115 generate the address data), pulsing a CLK signal 255 and scanning the data out of first scan chain 250 to the tester.

Figure 3:
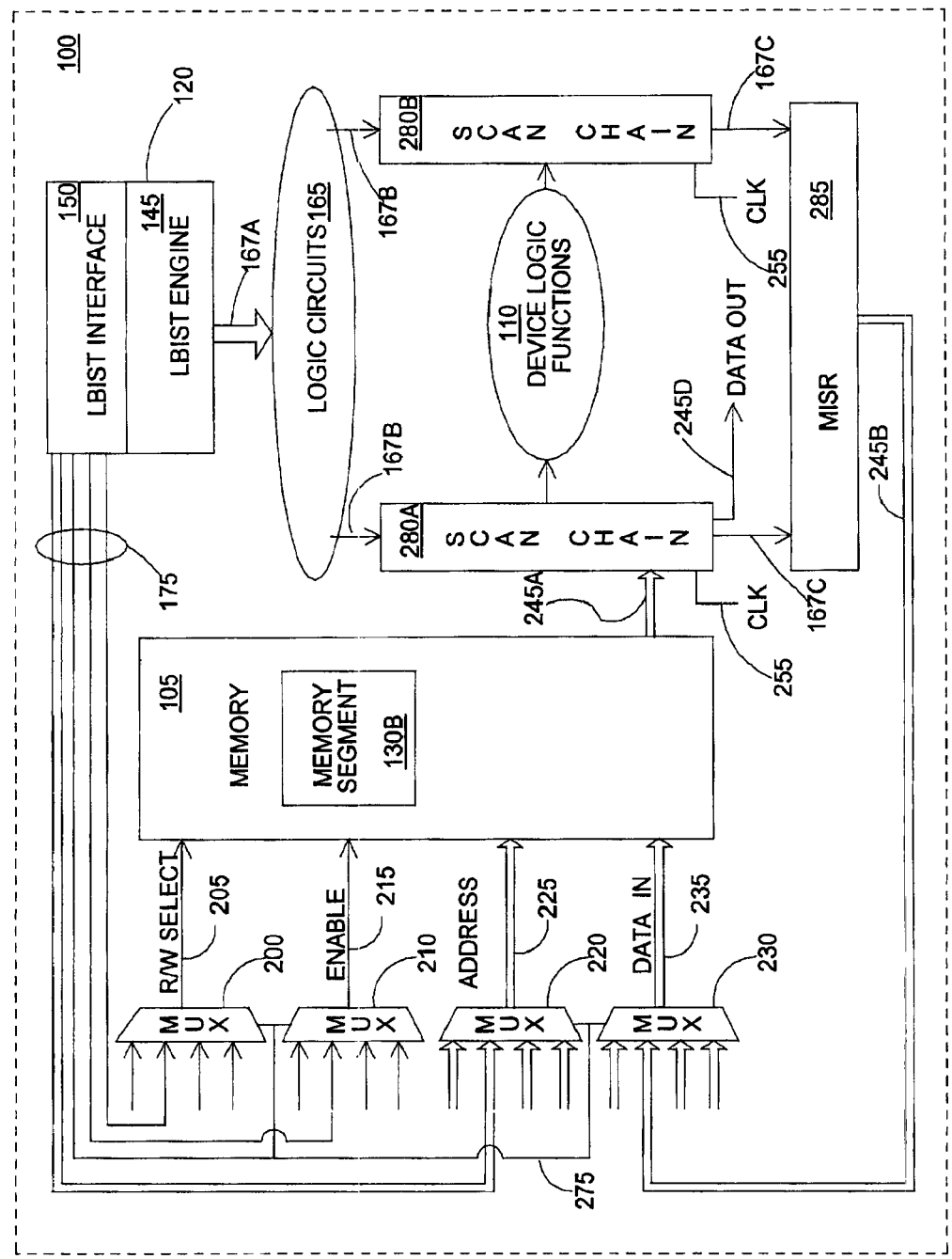
FIG. 3 is a detailed functional block diagram of a semiconductor device according to a second embodiment of the present invention.

FIG. 3 is a detailed functional block diagram of a semiconductor device according to a second embodiment of the present invention. In FIG. 3, a read/write (R/W) multiplexer (MUX) 200 is coupled to memory 105 (containing designated memory segment 130B) by a R/W select line 205 for placing memory 105 into a read or a write state in response to a R/W signal applied to the R/W select line by LBIST interface 150. An enable MUX 210 is coupled to memory 105 by an enable line 215 for enabling read or write to memory 105 in response to an enable signal applied to the enable line by LBIST interface 150. An address MUX 220 is coupled to memory 105 by an address bus 225 for selecting particular memory segments and particular memory cells in the memory to write data into or read data out of in response to an address word applied to the address bus by LBIST interface 150. A data MUX 230 is coupled to memory 105 by a data bus 235 for writing data applied to the data bus into the memory by LBIST interface 150. R/W select MUX 200, enable MUX 210, address MUX 220 and data in MUX 230 are controlled through control lines 275 in LBIST interface bus 175.

Memory 105 is coupled to a first scan chain 280A by a data out bus 245A. LBIST engine 145 is coupled to logic circuits 165 by test data bus 167A, and logic circuits 165 are coupled to first and last scan chains 280A and 280B by test data lines 167B. Device logic functions 110 are coupled between first scan chain 280A and a last scan chain 280B. While two scan chains (280A and 280B) are illustrated there may be up to twenty or more scan chains interspersed through device logic functions 110, each scan chain coupled between logic circuits 165 and a Multiple Input Shift Register (MISR) 285. A CLK signal 255 applied to all scan chains from first scan chain 280A through last scan chain 280B, controls scan-in and scan out of test patterns from LBIST engine 145 to MISR 285 via data lines 167C. Scan chain 280A also has an additional data out 245D for sending data from memory 105 out of semiconductor device 100. MISR 285 is coupled to an input of data in MUX 230 by test data bus 245B.

Repair function 190 is coupled between the tester and memory 105 (or integral with the memory) for performing soft repair of the memory.

In operation LBIST function 120 tests logic device functions 110, and the resultant pattern is scanned out through scan chains 280A and 280B into MISR 285. From MISR 285 the pattern is written into designated memory segment 130B through data out bus 245B, MUX 230 and data in bus 235.

Data collected in designated memory segment 130B is outputted to the tester by scanning in address data to address MUX 220 (or by having LBIST function 120 generate the address data), pulsing CLK signal 255 and scanning the data out of first scan chain 280A to the tester.

Figure 4:
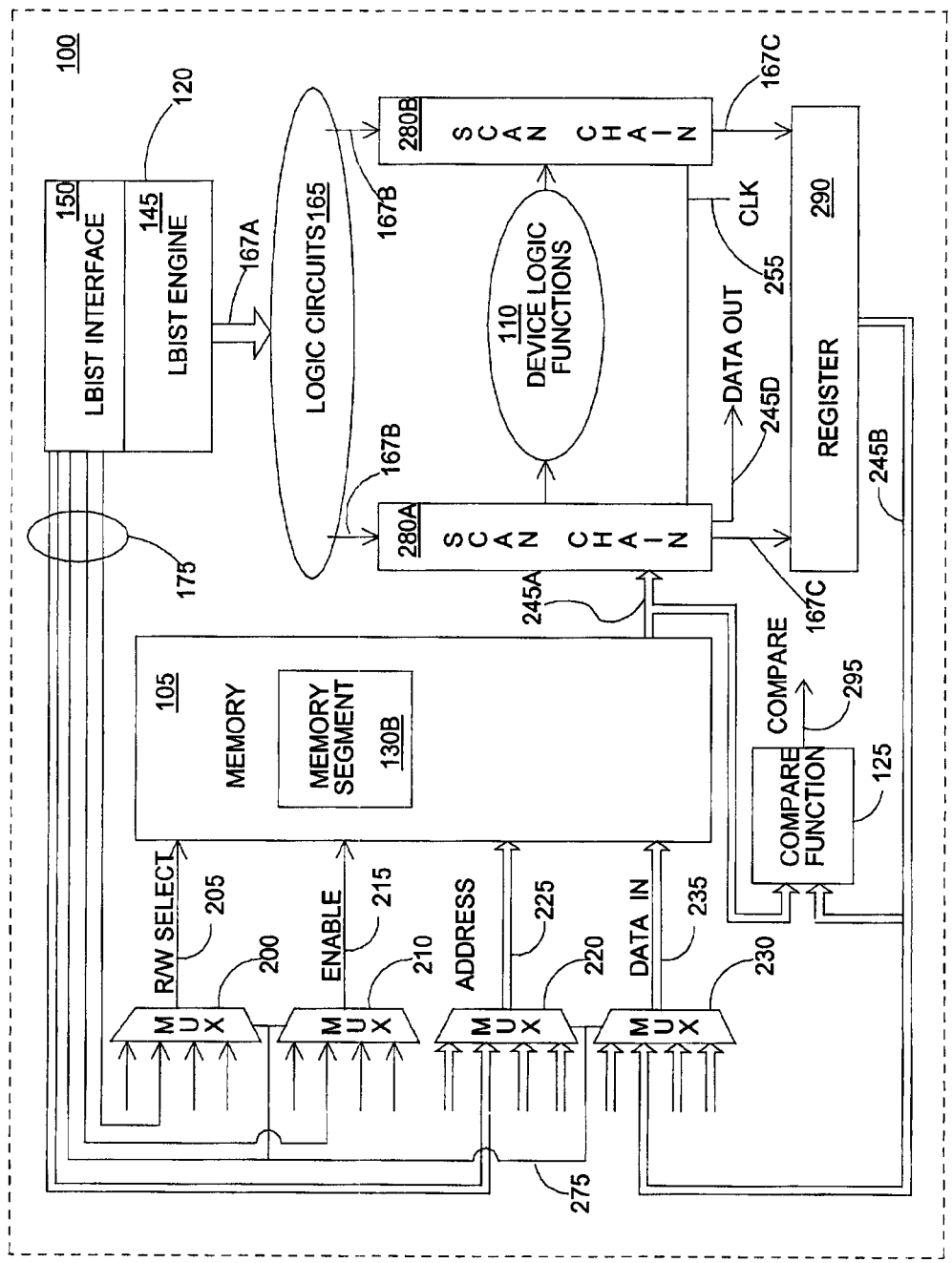
FIG. 4 is a detailed functional block diagram of a semiconductor device according to a third embodiment of the present invention.

FIG. 4 is a detailed functional block diagram of a semiconductor device according to a third embodiment of the present invention. In FIG. 4, a read/write (R/W) multiplexer (MUX) 200 is coupled to memory 105 (containing designated memory segment 130B) by a R/W select line 205 for placing memory 105 into a read or a write state in response to a R/W signal applied to the R/W select line by LBIST interface 150. An enable MUX 210 is coupled to memory 105 by an enable line 215 for enabling read or write to memory 105 in response to an enable signal applied to the enable line by LBIST interface 150. An address MUX 220 is coupled to memory 105 by an address bus 225 for selecting particular memory segments and particular memory cells in the memory to write data into or read data out of in response to an address word applied to the address bus by LBIST interface 150. A data MUX 230 is coupled to memory 105 by a data bus 235 for writing data applied to the data bus into the memory by LBIST interface 150. R/W select MUX 200, enable MUX 210, address MUX 220 and data in MUX 230 are controlled through control line 275 in LBIST interface bus 175.

Memory 105 is coupled to a first scan chain 280A and to a first input of compare function 125 by a data out bus 245A. LBIST engine 145 is coupled to logic circuits 165 by test data bus 167A, and logic circuits 165 are coupled to first and last scan chains 280A and 280B by test data lines 167B. Device logic functions 110 are coupled between first scan chain 280A and a last scan chain 280B. While two scan chains (280A and 280B) are illustrated, there may be up to twenty or more scan chains interspersed through device logic functions 110, each scan chain coupled between logic circuits 165 and a register 290. A CLK signal 255 applied to all scan chains from first scan chain 280A through last scan chain 280B, controls scan-in and scan out of test patterns from LBIST engine 145 to register 290 via data lines 167C. Scan chain 280A also has an additional data out 245D for sending data from memory 105 out of semiconductor device 100. Register 290 is coupled through data out bus 245B to an input of data in MUX 230 and to a second input of compare function 125. Compare function 125 has an output 295.

Repair function 190 is coupled between the tester and memory 105 (or integral with the memory) for performing soft repair of the memory.

In operation LBIST function 120 performs a first test of logic device functions 110, the resultant first pattern is scanned out through scan chains 280A and 280B into register 290. From register 290 the first pattern is written into designated memory segment 130B through data in MUX 230. Next, LBIST function 120 performs a second test of logic device functions 110, the resultant second pattern is scanned out through scan chains 280A and 280B into register 290. From register 290 the second pattern is compared in compare function 125 with data from the first pattern in memory segment 130B, and a compare signal 295 is outputted. As mentioned above, the first and second test patterns may be corner test patterns, in which case the results of testing two corners will be compared. The results of the compare of two corners can be converted into a simple pass/fail signal.

The number of addresses in memory segment 130B should match the length of scan chains 280A and 280B. If the number of addresses does not match, then alternative methods of storing the data must be used, such as folding multiple bits into the same address.

Figure 5:
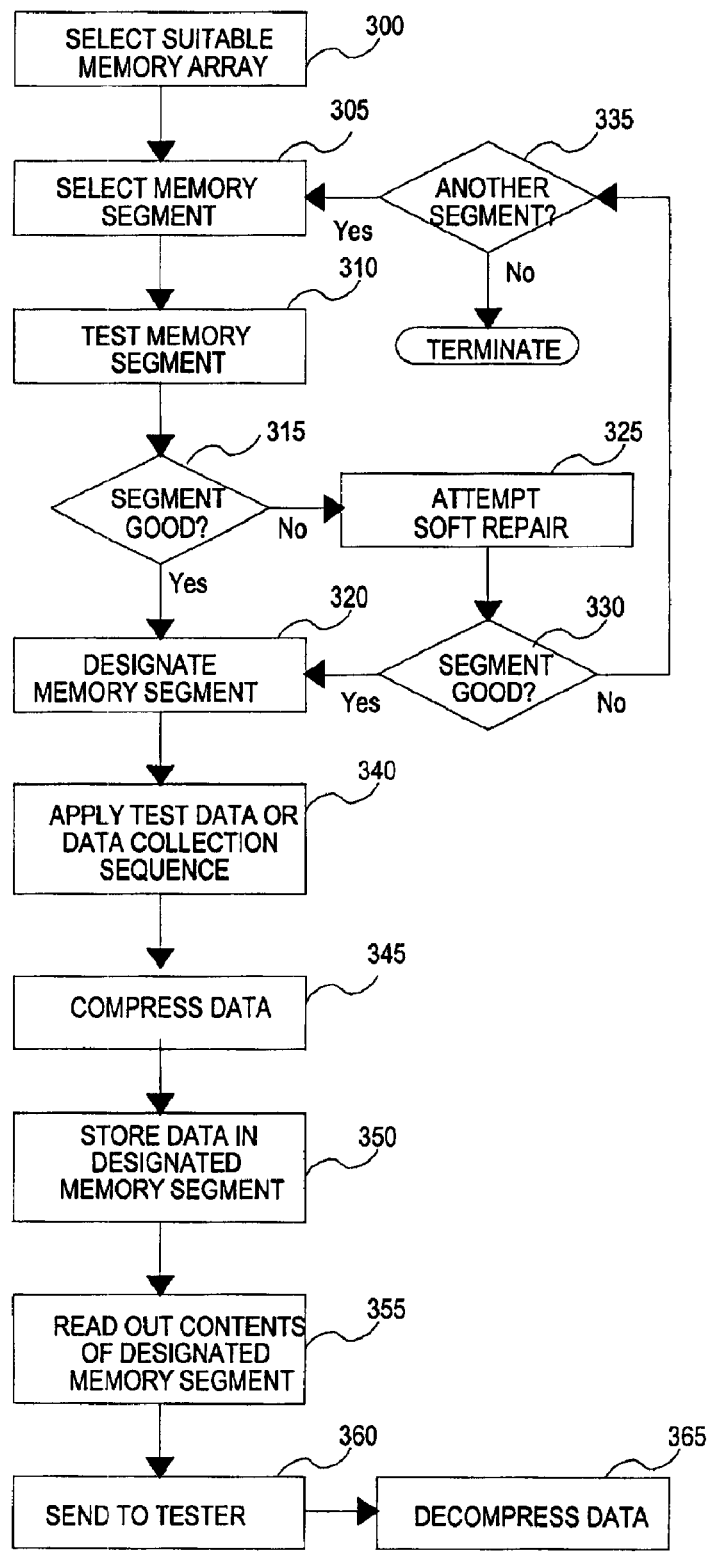
FIG. 5 is a flowchart illustrating the major method steps according to the present invention.

FIG. 5 is a flowchart illustrating the major method steps according to the present invention. In step 300, a suitable memory array is selected, in the present example this is memory 105. A suitable memory array is a memory array with enough words and bits per word in one or more memory segments to meet the storage requirements of the test data to be stored in that memory. This memory array may be a memory array designed for support of semiconductor device 100 functions and fabricated integral to the semiconductor device. Alternatively, the memory array may be one designed specifically for storage of test data. In the case of a memory specifically designed for storage of test data, the memory array may be fabricated integral to semiconductor device 100 or in the kerfs between semiconductor devices during wafer processing and wired to the semiconductor device. Dicing the wafer would sever the wiring. In step 305, a memory segment(s) of the memory array is selected.

Next, in step 310, the selected memory segment(s) is tested using ABIST engine 135. Alternatively, the selected memory segment(s) may be tested using a conventional memory tester having a test program and storage for the resultant test data. If, in step 315, the memory segment is good the method continues to step 320. If the memory segment is not good, then, in step 325, a soft repair is attempted. A soft repair is one that can be initiated from tester 155, and persists until at least completion of testing of semiconductor device 100. If, in step 330, the memory segment(s) is good, then the method continues to step 320. If the memory segment is not good then, in step 335, a determination is made if another untested memory segment (s) exists. If another untested memory segment exists the method loops back to step 305 otherwise the process terminates and the invention cannot be practiced using the selected memory array.

In step 320, the good memory segment is designated for storage of test data. In the present example, the designated memory segment(s) is memory segment 130B. In step 340, a test is performed on semiconductor device 100. In optional step 345, the test data is compressed. The compression can occur in the semiconductor device 100, in circuitry outside semiconductor device 100, or within the test program executed on tester 155. In step 350, the data resulting from the test is stored in the designated memory segment. In step 355, the contents of the designated memory segment are read out of the designated memory. In optional step 360, the test data is sent to tester 155. Finally, in step 365 the data is decompressed, if necessary.

Figure 6:
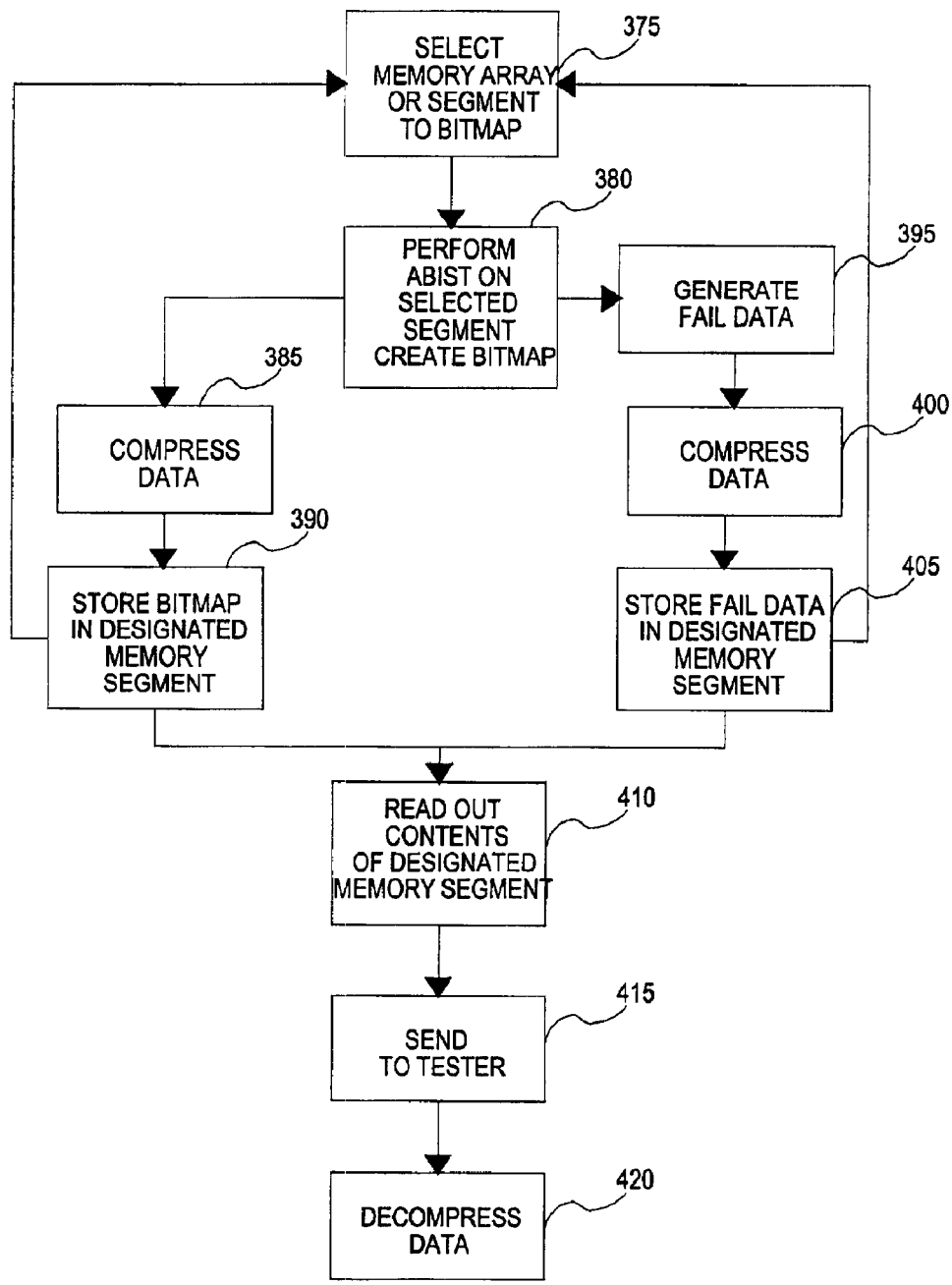
FIG. 6 is a flowchart illustrating the method steps of the first embodiment of the present invention.

FIG. 6 is a flowchart illustrating the method steps of a first embodiment of the present invention. In step 375, a memory array or memory segment on semiconductor device 100 is selected to bit-fail map. The selected array segment may be any of memory segments 130A through 130E from memory array 105 or a memory segment from one of memory 195. In step 380 ABIST is performed on the selected memory to create a bit map. Two options exist, the bit map can be stored directly or the bit map can be converted to a bit-fail map before storage by comparing actual with expected data. In optional step 385, the bit map itself may be compressed and then in step 390, stored in designated memory segment 130B. In step 395, fail data is generated by comparing actual data to the expected data. Then in optional step 400 the fail data is compressed and then in step 405, stored in designated memory segment 130B. If optional compress data step 400 is not performed, steps 375, 380, 395 and 405 may be repeated with the results of each loop being ORed with the data already in designated memory segment 130B. The OR function may reside in ABIST interface 140.

In step 410, the contents of the designated memory segment are read out of the designated memory. Data collected in designated memory segment 130B is outputted to the tester by repeatedly scanning in address data to address MUX 220, pulsing CLK signal 255 and scanning the data out of first scan chain 250 (to the tester) until all addresses have been read. In step 415, the test data is sent to tester 155. Finally, in step 420 the data is decompressed, if necessary.

Figure 7:
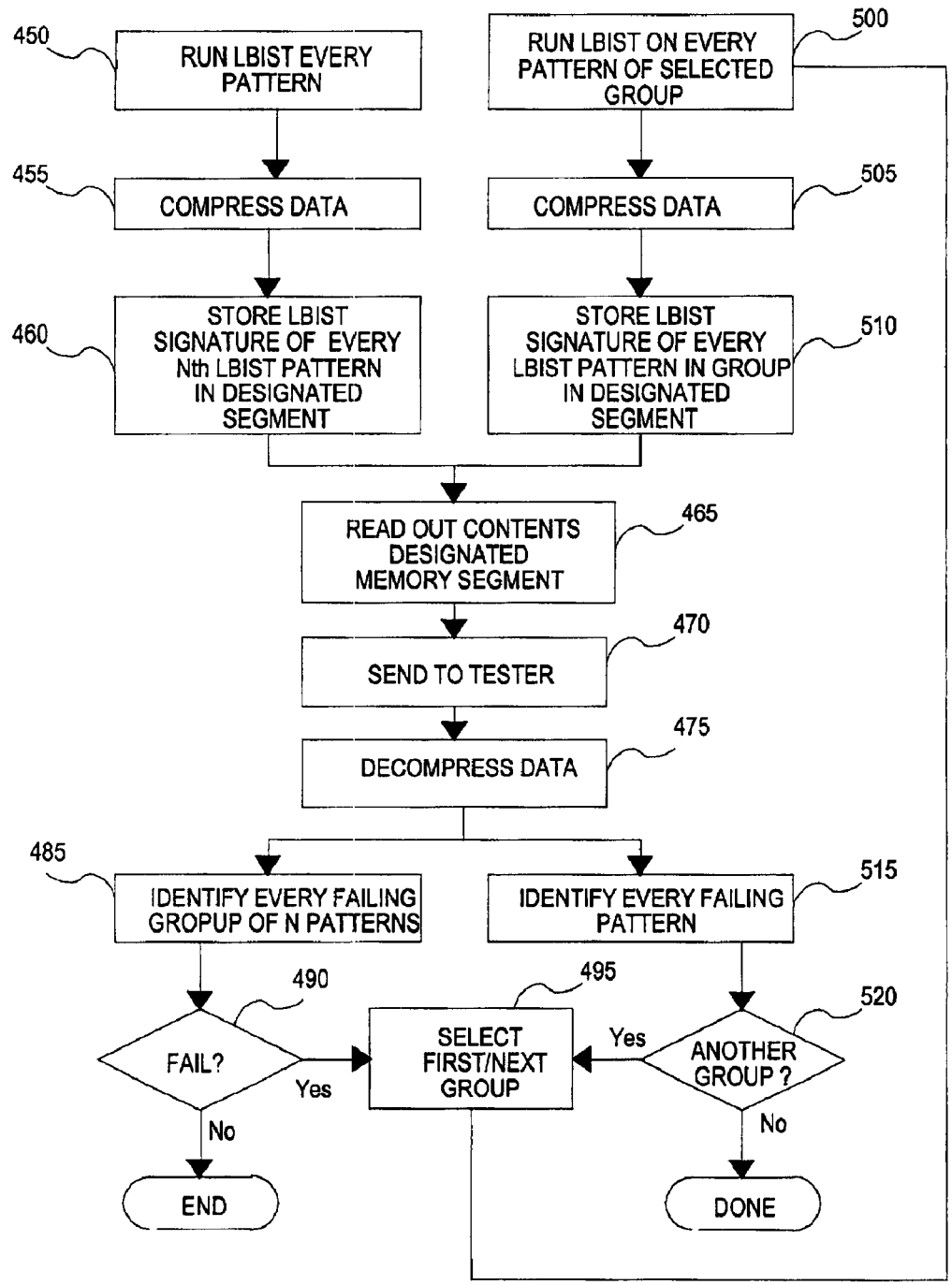
FIG. 7 is a flowchart illustrating the method steps of the second embodiment of the present invention.

FIG. 7 is a flowchart illustrating the method steps of a second embodiment of the present invention. In the present example, LBIST patterns are grouped into multiples of N test patterns, and the test description includes the cumulative fail signature for each group of N test patterns. In step 450, every LBIST pattern is applied to device logic functions 110. The LBIST signature in MISR 285 is not reset. In optional step 455, the cumulative fail signature for every N patterns (read from MISR 285) is compressed and in step 460, the cumulative fail signature for every N patterns is stored in designated memory segment 130B. It should be observed that the width of MISR 285 cannot exceed the word length of designated memory segment 130B.

In step 465, the contents of the designated memory segment are read out of the designated memory. Data collected in designated memory segment 130B is outputted to the tester by scanning in address data to address MUX 230, pulsing CLK signal 255 and scanning the data out of first scan chain 280A (to the tester.) In step 470, the test data is sent to tester 155. Finally, in step 475 the data is decompressed, if necessary.

In step 485, tester 155 determines which groups of N patterns, if any, failed. If in step 490, there were no fails, the method ends. If there were fails then in step 495, the first group of N patterns in which a fail occurred is selected and in step 500, every LBIST pattern in the selected group is applied to device logic functions 110. The LBIST pattern in MISR 285 is reset. In optional step 505, the fail signature for every pattern in the selected group (read from MISR 285) is compressed and in step 510, the LBIST signature for every pattern in the selected group is stored in designated memory segment 130B.

In step 515, tester 155 determines which pattern(s) in the selected group failed. Then in step 520, it is determined if there are additional failing groups of N patterns. If there are additional failing groups of N patterns, then the method loops to step 495, otherwise the process is complete. Thus each failing pattern is uniquely identified.

Figure 8:
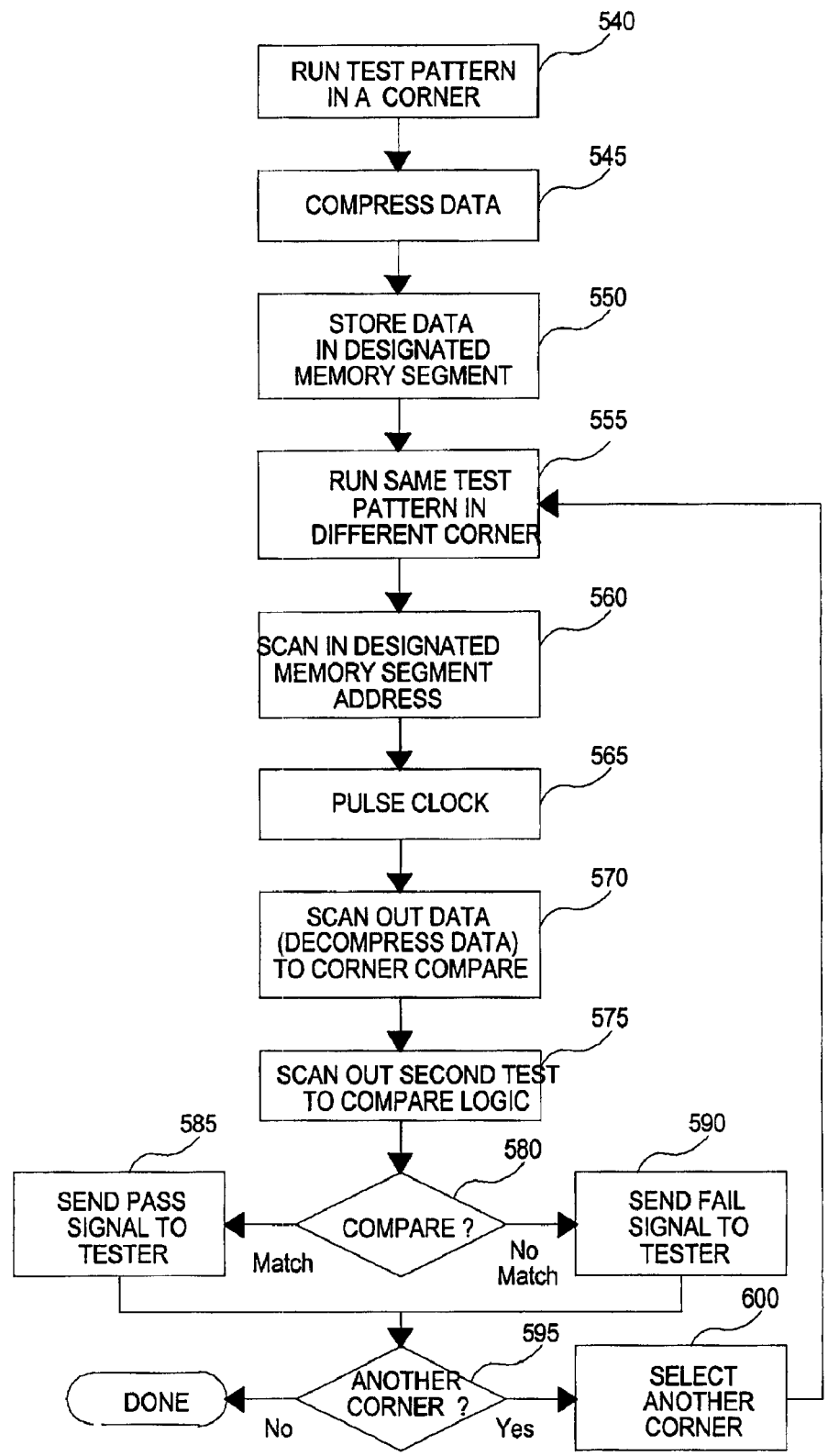
FIG. 8 is a flowchart illustrating the method steps of the third embodiment of the present invention.

FIG. 8 is a flowchart illustrating the method steps of a third embodiment of the present invention. A condition for the third embodiment is that memory segment 130B contains at least as many bits as there are scannable latches interfacing with device logic functions 110 if the test results are not to be compressed. As an option for improved performance, when the test results are not compressed, select or specifically supply a designated memory segment having a word length equal to the number of scan chains in device logic functions 110. In step 540, a specific test pattern is run at a first corner of the test specification to create a first set of test data. In optional step 545, the first set of test data is compressed. In step 550, the first set of test data is stored in designated memory segment 130B. Next in step 555 the same specific test pattern run in step 540 is run again, except at a different corner of the test specification to create a second set of test data.

Next, in step 560, the address of designated memory segment 130B is scanned into memory 105. Next in step 565, CLK signal 255 is pulsed and in step 570, the first set of test data is scanned out of memory segment 130B. In 570, the first set of test data is decompressed if it was compressed in step 545 and scanned out to test compare 125.

In step 575, the second set of test data is scanned out to test compare 125. Next, in step 580, if the first and second test data match then in step 585, a pass signal is sent to tester 155. If in step 580, the first and second test data do not match then in step 590, a fail signal is sent to tester 155. In step 595, it is determined if the specified test pattern is to be run at another, different corner. If not, the method is complete. If another corner is to be run, in step 600, the corner is selected and the method loops to step 555.

The description of the embodiments of the present invention is given above for the understanding of the present invention. It will be understood that the invention is not to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. A method of testing a semiconductor device comprising:
   selecting a portion of a memory, said memory comprised by said semiconductor device;
   testing said selected portion of said memory;
   designating said selected portion of said memory as a designated memory in response to an acceptable testing result; and
   storing data in said designated portion of said memory for retrieval at a later time, said data comprising test data resultant from additional testing of said semiconductor device and unrelated to testing said selected portion of said memory.

2. The method of claim 1, further including attempting a soft repair of said selected memory portion in response to an unacceptable test result and designating said selected portion of memory in response to a successful repair.

3. The method of claim 2, further including selecting and testing additional memory portions of said memory in response to an unacceptable test result and unsuccessful repair attempt until a portion of said memory having an acceptable test result or successful repair is found.

4. The method of claim 1, wherein said selected portion of memory is selected to have a sufficient word length and number of bits for storing said data.

5. The method of claim 1, further including compressing said data before storing said data in said designated portion of said memory.

6. The method of claim 5, further including decompressing said data after retrieving said data from said designated portion of said memory.

7. The method of claim 1, wherein said data comprises bitmaps, memory fail data, LBIST pass/fail signatures or pass/fail data.

8. The method of claim 1, further including sending said data to a tester.

9. The method of claim 1, wherein said data is generated by ABIST or LBIST.

10. A method of testing a semiconductor device having a memory, comprising:
    providing a designated memory;
    performing ABIST on a memory segment to generate memory test data;
    storing said memory test data in said designated memory; and
    retrieving said test data at a later time.

11. The method of claim 10, wherein said memory test data is a bitmap.

12. The method of claim 10, wherein said memory test data is fail data generated from a bitmap.

13. The method of claim 12, further including ORing additional test data with said test data already stored in said designated memory.

14. The method of claim 10, further including compressing said data before storing said data in said designated memory.

15. The method of claim 14, further including decompressing said data after retrieving said data from said designated memory.

16. A method of testing a semiconductor device having a memory, comprising:
    providing a designated memory;
    performing an LBIST on a device logic function to generate a set of LBIST signatures;
    storing said LBIST signatures in said designated memory; and
    retrieving said LBIST signatures at a later time.

17. The method of claim 16, further including compressing said data before storing said data in said designated memory.

18. The method of claim 17, further including decompressing said data after retrieving said data from said designated memory.

19. The method of claim 16, wherein said LBIST is run on every group of N patterns, each group of N patterns having a cumulative fail signature.

20. The method of claim 19, further including:
    identifying a failing group of N patterns;
    performing a second LBIST on said device logic functions using every LBIST pattern from said group of N patterns; and
    identifying every failing pattern in said group of N patterns.

21. A method of testing a function of a semiconductor device having a memory, comprising:
    providing a designated memory;
    performing a first test using a test pattern in a first corner of the test specification of said function of said semiconductor device;
    storing the result of said first test in said designated memory;
    performing a second test using said test pattern in a second corner of the test specification of said function of said semiconductor device;
    retrieving said first test result from said designated memory; and
    comparing said first test result with said second test result.

22. The method of claim 21, further including generating a pass signal in response to said first test result matching said second test result and generating a fail signal in response to said first test result not matching said second test result.

23. The method of claim 21 further including compressing said first test result before storing said first test result in said designated memory and decompressing said first test result after retrieving said first test result from said designated memory but before comparing said first test result to said second test result.

24. The method of claim 21 wherein said designated memory contains at least as many bits as there are latches in said function of said semiconductor device.

25. The method of claim 24, wherein said designated memory has a word length at least equal to the number of scan chains in said function of said semiconductor device.

26. A semiconductor device comprising:

a memory;

an ABIST engine adapted to test said memory; and an interface adapted to send test data to and receive test data from a designated portion of said memory, said test data comprising data unrelated to testing said memory.

27. The semiconductor device of claim 26, wherein said interface is an ABIST interface and said test data is bitmap data.

28. The semiconductor device of claim 27, wherein said ABIST interface includes a data compress function and said ABIST engine includes a data decompress function.

29. The semiconductor device of claim 26, further including an LBIST engine adapted to test device logic functions and wherein said interface is an LBIST interface and said test data comprises LBIST patterns.

30. The semiconductor device of claim 29, wherein said LBIST interface includes a data compress function and said LBIST engine includes a data decompress function.

31. The semiconductor device of claim 26, further including a corner compare function adapted to compare the results of a test pattern run in two corners of the test specification of said semiconductor device and wherein said interface is a corner interface and said test data is the result of a first corner test.

32. The semiconductor device of claim 31, wherein said corner interface includes a data compress function and said corner compare includes a data decompress function.

33. The semiconductor device of claim 26, further including a repair function adapted to soft repair said designated portion of said memory segment.

* * * * *